United States Patent
Kim et al.

(10) Patent No.: US 8,905,806 B2
(45) Date of Patent: Dec. 9, 2014

(54) METHODS OF MANUFACTURING OPTICAL SHEETS AND METHODS OF MANUFACTURING ORGANIC LIGHT EMITTING DISPLAY DEVICES HAVING OPTICAL SHEETS

(71) Applicant: Samsung Display Co., Ltd., Yongin, Gyunggi-Do (KR)

(72) Inventors: Ki-Seo Kim, Yongin (KR); Yi-Joon Ahn, Yongin (KR); Jong-In Baek, Yongin (KR); Won-Sang Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 78 days.

(21) Appl. No.: 13/865,148

(22) Filed: Apr. 17, 2013

(65) Prior Publication Data
US 2013/0344766 A1    Dec. 26, 2013

(30) Foreign Application Priority Data

Jun. 22, 2012  (KR) .......................... 10-2012-0067385

(51) Int. Cl.
| H01L 51/50 | (2006.01) |
| H05B 33/10 | (2006.01) |
| H01L 51/00 | (2006.01) |
| H01L 27/32 | (2006.01) |

(52) U.S. Cl.
CPC ............ *H05B 33/10* (2013.01); *H01L 51/0001* (2013.01); *H01L 27/322* (2013.01)
USPC .............................................. 445/24; 313/504

(58) Field of Classification Search
USPC .............................................. 445/24; 313/504
See application file for complete search history.

(56) References Cited

U.S. PATENT DOCUMENTS 6,641,933 B1 *  11/2003  Yamazaki et al. ............ 428/690
2005/0231108 A1 *  10/2005  Furukawa ..................... 313/506

FOREIGN PATENT DOCUMENTS

| KR | 10-2006-0055052 A | 5/2006 |
| KR | 10-2011-0018785 A | 2/2011 |
| KR | 10-2012-0002442 A | 1/2012 |

* cited by examiner

*Primary Examiner* — Mary Ellen Bowman
(74) *Attorney, Agent, or Firm* — Knobbe Martens Olson & Bear LLP

(57) ABSTRACT

A method of manufacturing an optical sheet includes providing a first stacked structure comprising a plurality of first light shielding layers and a plurality of color filter layers which are alternately stacked, and cutting the first stacked structure to form a plurality of optical films. Each optical film includes first and second cut faces, the second cut face being parallel to the first cut face, each optical film comprising a plurality of light shielding layer sections and a plurality of color filter layer sections extending in a first direction. The method further includes forming a second stacked structure comprising a plurality of second light shielding layers and the plurality of optical films which are alternately stacked; and cutting the second stacked structure to form an optical sheet which comprises third and fourth cut faces, the fourth cut face being parallel to the third cut face.

18 Claims, 13 Drawing Sheets

METHODS OF MANUFACTURING OPTICAL SHEETS AND METHODS OF MANUFACTURING ORGANIC LIGHT EMITTING DISPLAY DEVICES HAVING OPTICAL SHEETS

CROSS-REFERENCE TO RELATED APPLICATION

This application claims priority under 35 USC §119 to Korean Patent Application No. 10-2012-0067385 filed on Jun. 22, 2012 in the Korean Intellectual Property Office (KIPO), the contents of which are herein incorporated by reference in its entirety.

BACKGROUND

1. Field

The present disclosure relates to methods of manufacturing optical sheets and methods of manufacturing organic light emitting display devices including optical sheets.

2. Related Technology

An organic light emitting display (OLED) device may display desired information such as images, letters and/or characters using a light generated by combining holes provided from an anode with electrons provided from a cathode in an organic layer thereof. The OLED device may ensure relatively large view angle, rapid response speed, relatively reduced thickness, low power consumption, etc. Accordingly, the OLED device may be certainly expected to be one of the most prospecting next-generation display devices.

An OLED device may include an array of pixels which may have pixels for a red color of light, a green color of light and a blue color of light, respectively. An optical sheet including red color filters, green color filters and blue color filters may be disposed on an OLED panel to improve color purity.

SUMMARY

An aspect provides methods of manufacturing optical sheets having improved optical characteristics.

Another aspect provides methods of manufacturing organic light emitting display devices including optical sheets having improved optical characteristics.

Still another aspect provides a method of manufacturing an optical sheet. The method comprises providing a first stacked structure comprising a plurality of first light shielding layers and a plurality of color filter layers which are alternately stacked; cutting the first stacked structure to form a plurality of optical films, each of which comprises first and second cut faces, the second cut face being parallel to the first cut face, each optical film comprising a plurality of light shielding layer sections and a plurality of color filter layer sections extending in a first direction, two immediately neighboring light shielding layer sections being spaced apart from each other and two immediately neighboring color filter layer sections being spaced apart from each other; forming a second stacked structure comprising a plurality of second light shielding layers and the plurality of optical films which are alternately stacked; cutting the second stacked structure to form an optical sheet which comprises third and fourth cut faces, the fourth cut face being parallel to the third cut face.

In the foregoing method, a distance between the first cut face and the second cut face may define a thickness of the optical film, and a distance between the third cut face and the fourth cut face may define a thickness of the optical sheet.

In the foregoing method, the first cut face and the second cut face may be substantially parallel to the first direction, and the third cut face and the fourth cut face may be substantially perpendicular to the first direction.

In the foregoing method, forming the first stacked structure may include repeatedly performing a cycle of forming one first light shielding layer on one color filter layer and forming another color filter layer on the one first light shielding layer.

In the foregoing method, forming the first stacked structure may include providing a plurality of first light shielding films, providing a plurality of color filter films, alternately arranging the color filter films and the first light shielding films, respectively and laminating the color filter films and the first light shielding films to form the first stacked structure comprising the color filter layers and the first light shielding layers.

In the foregoing method, forming the second stacked structure may include repeatedly performing a cycle of forming one second light shielding layer on one optical film and forming another optical film on the one second light shielding layer.

In the foregoing method, forming the second stacked structure may include providing a plurality of second light shielding films, providing a plurality of optical films, alternately arranging the optical films and the second light shielding films, respectively and laminating the optical films and the second light shielding films to form the second stacked structure comprising the plurality of second light shielding layers and the plurality of optical films.

In the foregoing method, each of the color filter layers may have the same thickness, each of the first light shielding layers may have the same thickness, each of the optical films may have the same thickness and each of the second light shielding layers may have the same thickness.

In the foregoing method, each of the first light shielding layers may have the same thickness, each of the second light shielding layers may have the same thickness, at least two of the color filter layers may have different thicknesses from each other, and at least two of the optical films may have different thicknesses from each other.

In the foregoing method, the color filter layers may include a first color filter layer configured to transmit a red color of light, a second color filter layer configured to transmit a green color of light and a third color filter layer configured to transmit a blue color of light.

In the foregoing method, the optical sheet may include a first color filter segment configured to transmit a red color of light, a second color filter segment configured to transmit a green color of light and a third color filter segment configured to transmit a blue color of light.

A further aspect provides a method of manufacturing an organic light emitting display device. The method comprises: forming a display panel comprising a switching device, a first electrode, an organic light emitting structure and a second electrode, the display panel comprising an array of pixels and a non-pixel region neighboring the pixels, wherein the pixels are arranged in a first direction and a second direction perpendicular to the first direction; and providing an optical sheet over the display panel, wherein providing the optical sheet comprising: providing a first stacked structure comprising a plurality of first light shielding layers and a plurality of color filter layers which are alternately stacked; cutting the first stacked structure to form a plurality of optical films, each of which comprises first and second cut faces, the second cut face being parallel to the first cut face, each optical film comprising a plurality of light shielding layer sections and a plurality of color filter layer sections extending in a first direction, and two immediately neighboring light shielding layer sections being spaced apart from each other, and two immediately neighboring color filter layer patterns being spaced apart from each other; forming a second stacked structure a plurality of second light shielding layers and the plurality of optical films which are alternately stacked; cutting the second stacked structure to form an optical sheet which comprises third and fourth cut faces, the fourth cut face being parallel to the third cut face.

In the foregoing method, a distance between the first cut face and the second cut face may define a thickness of the optical film, and a distance between the third cut face and the fourth cut face may define a thickness of the optical sheet.

In the foregoing method, the first cut face and the second cut face may be substantially parallel to the first direction, and the third cut face and the fourth cut face may be substantially perpendicular to the first direction.

In the foregoing method, each of the color filter layers may have the same thickness, each of the first light shielding layers may have the same thickness, each of the optical films may have the same thickness and each of the second light shielding layers may have the same thickness.

In the foregoing method, the thickness of one the color filter layers may be substantially the same as at least one of width and height of one of the pixels.

In the foregoing method, the thickness of one of the optical films may be substantially the same as at least one of width and height of one of the pixels.

In the foregoing method, the array of pixels may include a first pixel, a second pixel and a third pixel, and the optical sheet may include a first color filter segment corresponding to the first pixel, a second color filter segment corresponding to the second pixel and a third color filter segment corresponding to the third pixel.

According to embodiments, an optical sheet including first to third color filter segments may be obtained without performing a patterning process. When optical sheet is arranged on a display panel, the first to the third color filter segments may correspond to pixels of the organic light emitting display device. Therefore, color purity in each pixel of the organic light emitting display device may be improved.

BRIEF DESCRIPTION OF THE DRAWINGS

Embodiments will be more clearly understood from the following detailed description taken in conjunction with the accompanying drawings.

FIGS. 1 to 10 are perspective views illustrating a method of manufacturing an optical sheet in accordance with embodiments;

FIGS. 11 to 14 are perspective views illustrating a method of manufacturing an optical sheet in accordance with some embodiments;

FIGS. 15 and 16 are perspective views illustrating a method of manufacturing an optical sheet in accordance with some embodiments; and FIGS. 17 to 19 are a perspective view and cross-sectional views illustrating a method of manufacturing an organic light emitting display device in accordance with embodiments.

DESCRIPTION OF EMBODIMENTS

Figure 1:
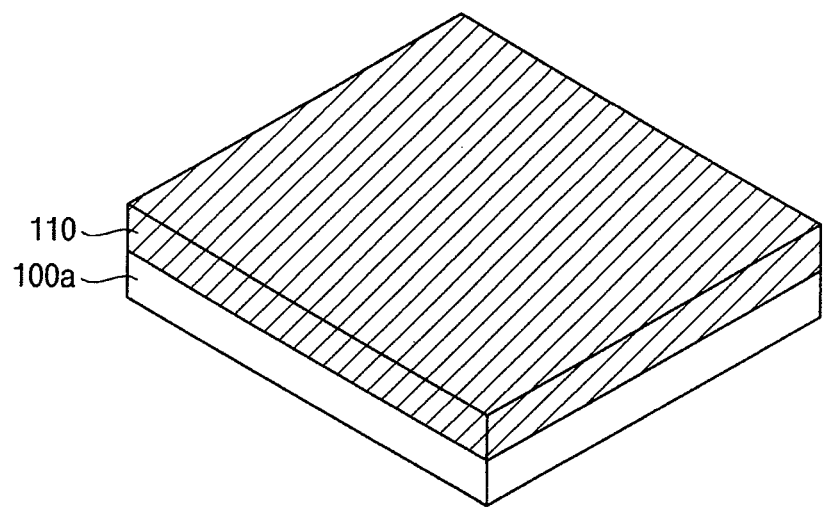
FIGS. 1 to 19 represent non-limiting, embodiments as described herein.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 10 are perspective views illustrating a method of manufacturing an optical sheet in accordance with embodiments. In embodiments, the optical sheet can be used for an organic light emitting device including an array of pixels, which include red color pixels, green color pixels and blue color pixels.

Referring to FIG. 1, a first color filter layer 110 may be formed on a first light shielding layer 100a.

The first light shielding layer 100a may include an organic material that may block an incident light. For example, the first light shielding layer 100a may include a binder resin, a black pigment, etc. The first light shielding layer 100a may have a predetermined thickness. In embodiments, the thickness of the first light shielding layer 100a may be substantially the same as or substantially similar to a distance between two immediately neighboring pixels of a display device (see FIG. 17).

The first color filter layer 110 may be coated on the first light shielding layer 100a. In embodiments, the first color filter layer 110 may be obtained by a dip coating process, a spin coating process, a screen coating process, a spray coating process, a knife coating process, a gravure coating process, an ultrasonic atomizing coating process, a spray-mist atomizing coating process, an offset printing process, an inkjet printing process, a pad printing process, etc.

In embodiments, the first color filter layer 110 may be formed on the first light shielding layer 100a by a spin coating process using a coating solution that may include a binder resin, a photo polymerization initiator, a first color pigment, etc.

The first color filter layer 110 may allow one of a red color of light, a green color of light and a blue color of light to pass therethrough. In an embodiment, the first color filter layer 110 may have a relatively high transmittance relative to the red color of light.

The first color filter layer 110 may have a predetermined thickness. The thickness of the first color filter layer 110 may be substantially the same as or substantially similar to at least one of widths and heights of the pixels of the display device (see FIG. 17).

Figure 2:
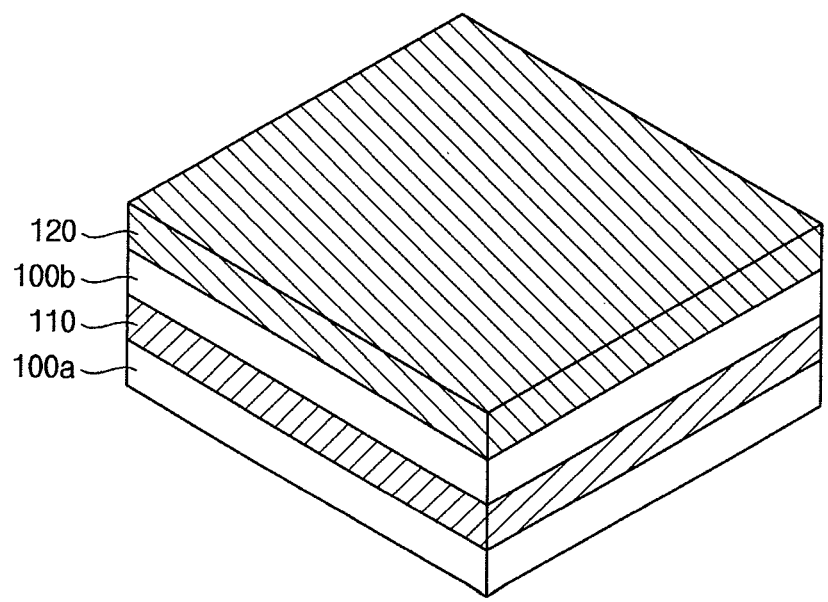

Referring to FIG. 2, another first light shielding layer 100b and a second color filter layer 120 may be sequentially formed on the first color filter layer 110.

Another first light shielding layer 100b may have a thickness and a material substantially the same as or substantially similar to those of the first light shielding layer 100a, respectively. For example, another first light shielding layer 100b may be formed on the first color filter layer 110 by a dip coating process, a spin coating process, a screen coating process, a spray coating process, a knife coating process, a gravure coating process, an ultrasonic atomizing coating process, a spray-mist atomizing coating process, an offset printing process, an inkjet printing process, a pad printing process, etc.

The second color filter layer 120 may be coated on another first light shielding layer 100b. The second color filter layer 120 may be formed by a process substantially the same as or substantially similar to that of forming the first color filter layer 110. For example, the second color filter layer 120 may be obtained by a spin coating process using a coating solution that may include the binder resin, the photo polymerization initiator, a second color pigment, etc.

The second color filter layer 120 may allow one of a red color of light, a green color of light and a blue color of light to pass therethrough. In an embodiment, the second color filter layer 120 may have a relatively high transmittance with respect to the green color of light.

Figure 17:
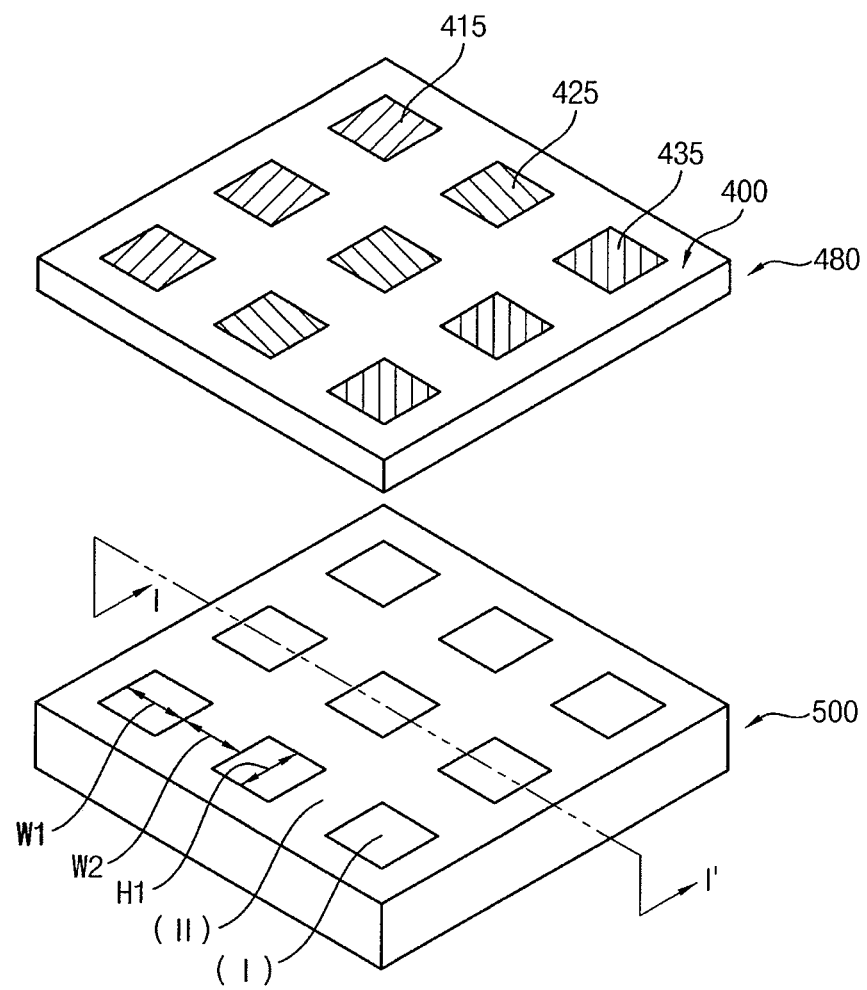

A thickness of the second color filter layer 120 may be substantially the same as or substantially similar to at least one of widths and heights of the pixels of the display device (see FIG. 17). In embodiments, the second color filter layer 120 may have a thickness substantially the same as or substantially similar to that of the first color filter layer 110.

Figure 3:
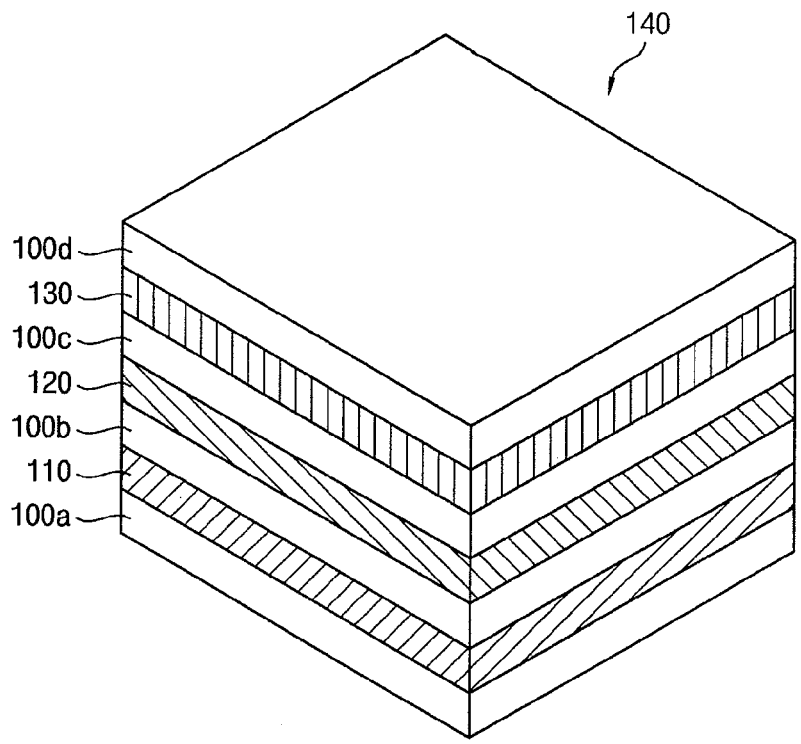

Referring to FIG. 3, still another first light shielding layer 100c and a third color filter layer 130 may be formed on the second color filter layer 120, and the above-described processes may be performed repeatedly to provide a first stacked structure 140 including the first light shielding layers 100a, 100b and 100c and the first to the third color filter layers 110, 120 and 130.

Processes for forming still another first light shielding layer 100c and the third color filter layer 130 may be substantially the same as or substantially similar to the processes for forming another first light shielding layer 100b and the second color filter layer 120 described with reference to FIG. 2. However, the third color filter layer 130 may allow a different color of light to pass therethrough compared to the second color filter layer 120. In an embodiment, the third color filter layer 130 may have a relatively high transmittance relative to the blue color of light.

The coating processes described with reference to FIGS. 1 to 3 may be performed repeatedly to provide the first stacked structure 140 including a plurality of first light shielding layers 100a, 100b, 100c and 100d and a plurality of color filter layers 110, 120 and 130, which may be stacked alternately and repeatedly. In embodiments, the first to the third color filter layers 110, 120 and 130 may be coated in a sequence illustrated in FIGS. 1 to 3. In some embodiments, the first to the third color filter layers 110, 120 and 130 may be formed in a sequence substantially different from those illustrated in FIGS. 1 to 3.

In embodiments, the first stacked structure 140 may include the first light shielding layers 100a, 100b, 100c and 100d, which may have substantially the same thicknesses. Additionally, the first stacked structure 140 may include the first to the third color filter layers 110, 120 and 130, which may have substantially the same thicknesses. In some embodiments, the first stacked structure 140 may include the first light shielding layers 100a, 100b, 100c and 100d that may have different thicknesses from one another.

For convenience of illustration and description, the first stacked structure 140 may be depicted to include four first light shielding layers 100a, 100b, 100c and 100d and three color filter layers 110, 120 and 130 illustrated in FIG. 3, however, the invention may not be limited to such a construction of the first stacked structure 140. For example, the processes for forming the first light shielding layers 100a, 100b, 100c and 100d and the processes for forming the color filter layers 110, 120 and 130 may be repeated from hundreds of times to thousands of times. Therefore, the first stacked structure 140 may include hundreds or thousands of the first light shielding layers and the color filter layers, which may be stacked alternately and repeatedly. In embodiments, the number of the first light shielding layers and the color filter layers may correspond to the number of pixels in one row or in one column of the display panel (see FIG. 17).

Figure 4:
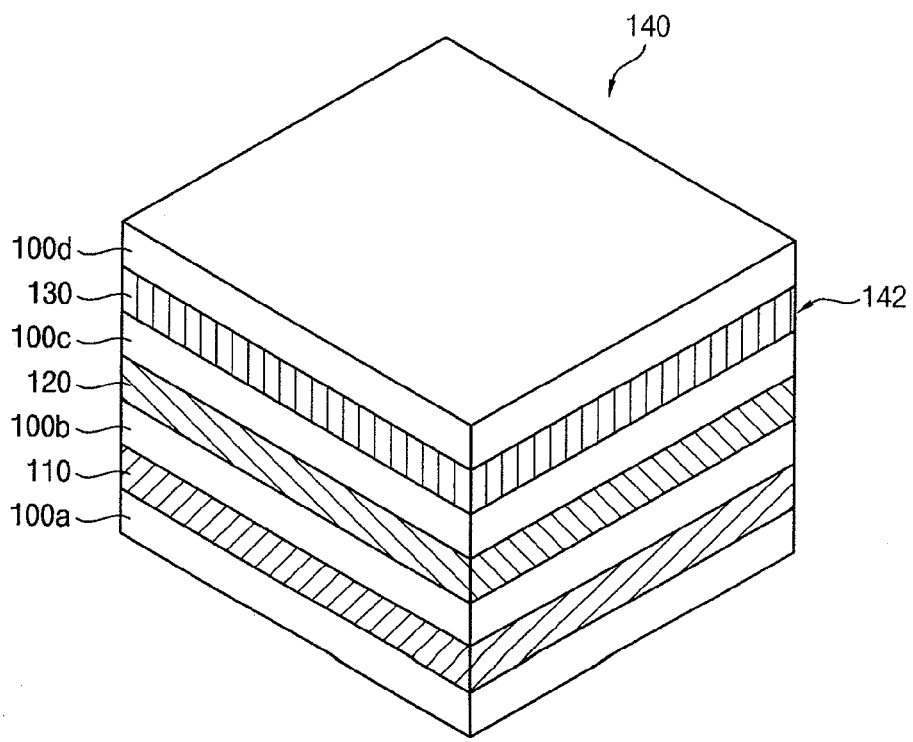

Referring to FIG. 4, the first stacked structure 140 may be cut to provide a first cut face 142.

A first portion of the first stacked structure 140 may be cut by an optical process, a physical process, a thermal process, a chemical process or a combination thereof. In one embodiment, the first portion of the first stacked structure 140 may be cut using a laser cutting machine. In another embodiment, the first portion of the first stacked structure 140 may be cut using a rotary cutting blade.

The first cut face 142 may be obtained as described above. The first cut face 142 may have a predetermined angle with respect to interfaces among the first light shielding layers 100a, 100b, 100c and 100d and the color filter layers 110, 120 and 130. For example, the first cut face 142 may be substantially perpendicular relative to an interface between the first light shielding layer 100a and the first color filter layer 110.

Figure 5:
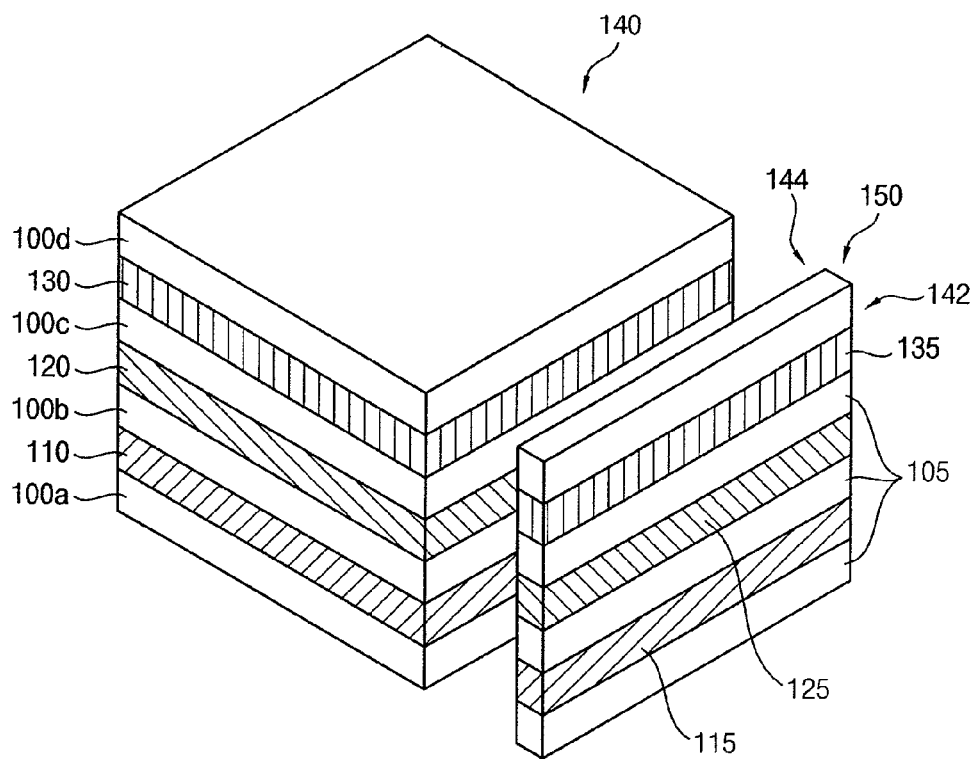

Referring to FIG. 5, the first stacked structure 140 may be cut or sliced to provide a second cut face 144 to thereby form a first optical film 150.

A second portion of the first stacked structure 140 having the first cut face 142 may be cut by an optical process, a physical process, a thermal process, a chemical process or a combination thereof. For example, the process of cutting the second portion of the first stacked structure 140 may be substantially the same as the process described with reference to FIG. 4.

The second cut face 144 may be obtained as described above. The second cut face 144 may substantially oppose to the first cut face 142. In embodiments, the second cut face 144 may be substantially parallel to the first cut face 142. Further, the second cut face 144 may be spaced apart from the first cut face 142 by a predetermined distance. The distance between the first cut face 142 and the second cut face 144 may be substantially the same as or substantially similar to at least one of widths and heights of the pixels of the display device (see FIG. 17). In embodiments, when the thicknesses of the first to the third color filter layers 110, 120 and 130 may be substantially the same as or substantially similar to widths of the pixels of the display device, the distance between the first cut face 142 and the second cut face 144 may be substantially the same as or substantially similar to the heights of the pixels of the display device. In some embodiments, when the thicknesses of the first to the third color filter layers 110, 120 and 130 may be substantially the same as or substantially similar to heights of the pixels of the display device, the distance between the first cut face 142 and the second cut face 144 may be substantially the same as or substantially similar to the widths of the pixels of the display device.

With the above-described cutting processes, the first optical film 150 having the first cut face 142 and the second cut face 144 may be obtained. In this case, a thickness of the first optical film 150 may be substantially the same as or substantially similar to a distance between the first cut face 142 and the second cut face 144. Additionally, the first optical film 150 may include a plurality of elongated light shielding layer sections or bands 105 and first to third elongated color filter layer sections or bands 115, 125, and 135, which may extend in a predetermined direction.

For convenience of illustration and description, the process for forming the first cut face 142 and the process for forming the second cut face 144 may be performed successively, however, the invention may not be limited to such an order. For example, the process for forming the first cut face 142 and the process for forming the second cut face 144 may be performed simultaneously.

Figure 6:
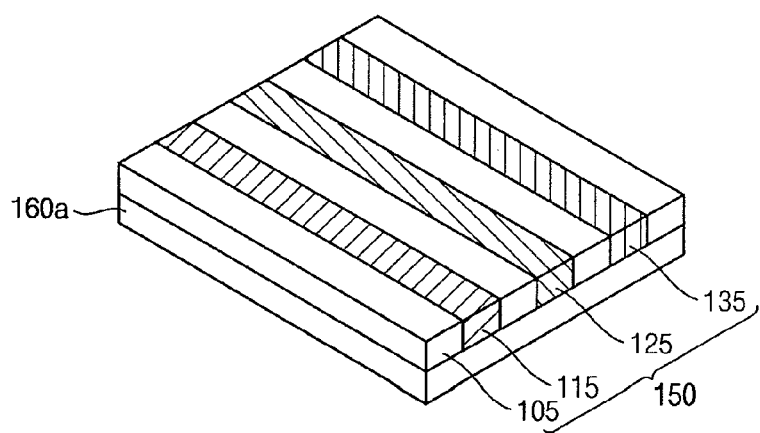

Referring to FIG. 6, the first optical film 150 may be formed on a second light shielding layer 160a.

The second light shielding layer 160a may include a material substantially the same as or substantially similar to that of the first light shielding layer 100a described with reference to FIG. 1.

The first optical film 150 formed by the processes described with reference to FIGS. 1 to 5 may be arranged on the second light shielding layer 160a. In this case, the first optical film 150 may include a plurality of light shielding layer sections 105 and the first to the third color filter sections 115, 125 and 135.

In embodiments, the first optical film 150 may be laminated on the second light shielding layer 160a. In some embodiments, an adhesion layer (not illustrated) may be additionally formed between the first optical film 150 and the second light shielding layer 160a.

Figure 7:
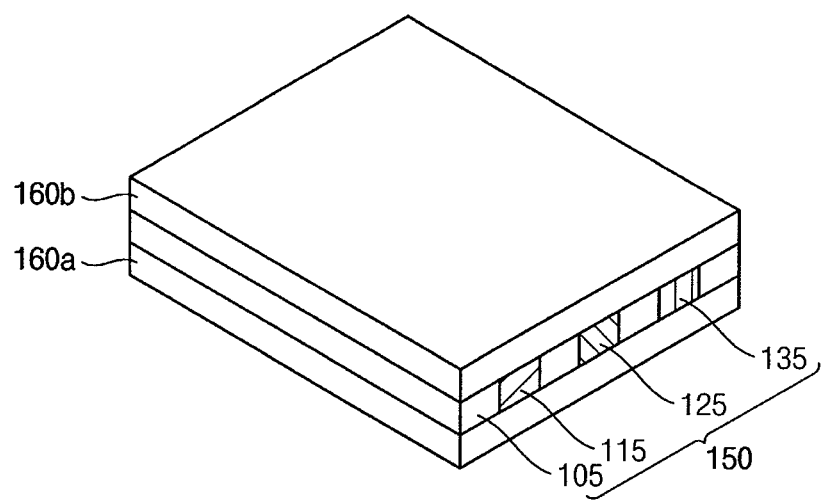

Referring to FIG. 7, another second light shielding layer 160b may be formed on the first optical film 150.

Another second light shielding layer 160b may include a material substantially the same as or substantially similar to that of the second light shielding layer 160a described with reference to FIG. 6. In embodiments, another second light shielding layer 160b may have a thickness substantially the same as or substantially similar to that of the second light shielding layer 160a described with reference to FIG. 6. In some embodiments, another second light shielding layer 160b may have a thickness different from that of the second light shielding layer 160a described with reference to FIG. 6.

Another second light shielding layer 160b may be coated on the first optical film 150 by a coating process substantially the same as or substantially similar to the coating process described with reference to FIG. 2.

Figure 8:
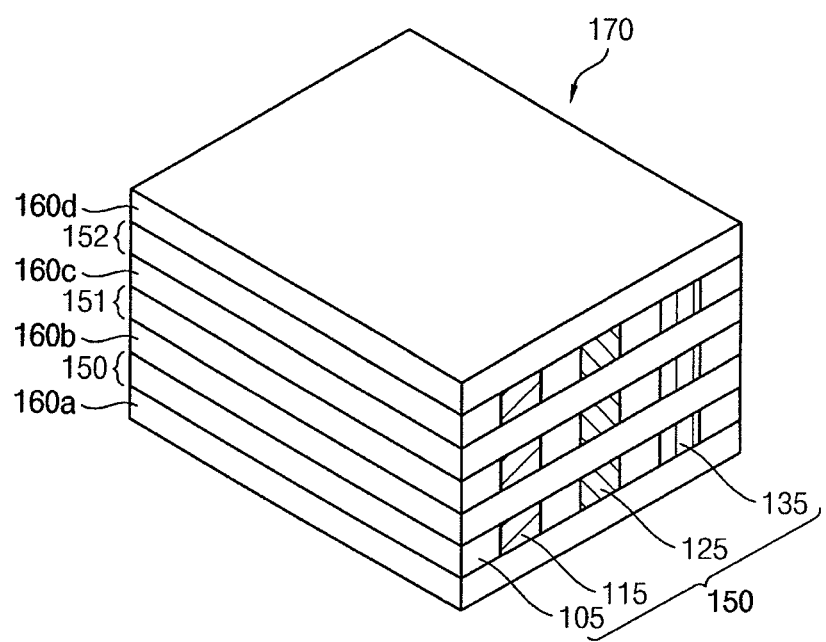

Referring to FIG. 8, the above-described processes described with reference to FIGS. 6 and 7 may be performed repeatedly to provide a second stacked structure 170.

By performing the above-described process, the second stacked structure 170 may be formed to include a plurality of second light shielding layers 160a, 160b, 160c and 160d and first to third optical films 150, 151 and 152 arranged alternately and repeatedly. That is, another second light shielding layer 160b may be coated on the first optical film 150, the second optical film 151 may be formed on another second light shielding layer 160b, and still another second light shielding layer 160c may be coated on the second optical film 151. The third optical film 152 and still another second light shielding layer 160d may be sequentially formed on still another second light shielding layer 160c. Processes for forming the second optical film 151 and the third optical film 152 may be substantially the same as or substantially similar to those for forming the first optical film 150.

In embodiments, the second stacked structure 170 may include the second light shielding layers 160a, 160b, 160c and 160d having substantially the same thicknesses, and the first to the third optical films 150, 151 and 152 having substantially the same thicknesses. In some embodiments, the second stacked structure 170 may include the second light shielding layers 160a, 160b, 160c and 160d having different thicknesses from one another, respectively.

For convenience of illustration and description, the second stacked structure 170 may include four second light shielding layers 160a, 160b, 160c and 160d and three optical films 150, 151 and 152 illustrated in FIG. 8, however, the invention may not be limited to such a construction of the second stacked structure 170. For example, the processes for forming the second light shielding layers and the processes for forming the optical films may be repeated from hundreds of times to thousands of times. Therefore, the second stacked structure 170 may include hundreds or thousands of the second light shielding layers and the optical films, which may be stacked alternately and repeatedly.

Figure 9:
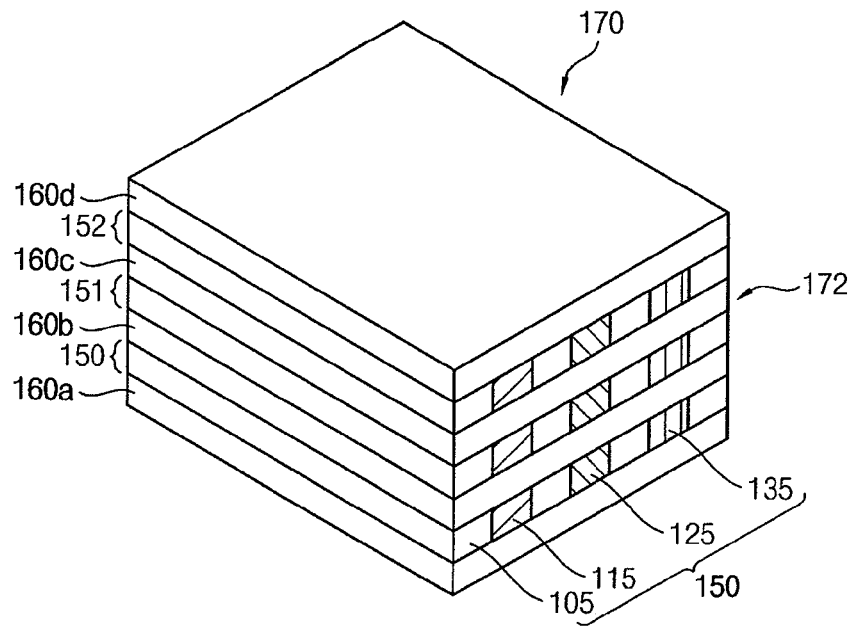

Referring to FIG. 9, the second stacked structure 170 may be cut to provide a third cut face 172.

A first portion of the second stacked structure 170 may be cut by an optical process, a physical process, a thermal process, a chemical process or a combination thereof. In one embodiment, the process of cutting the first portion of the second stacked structure 170 may be substantially the same as the method described with reference to FIG. 4. Therefore, the third cut face 172 may have a predetermined angle with respect to interfaces among the second light shielding layers 160a, 160b, 160c and 160d and the three optical films 150, 151 and 152. For example, the third cut face 172 may be substantially perpendicular to an interface between the second light shielding layer 160a and the first optical film 150, and may be substantially perpendicular to a direction in which the first to the third color filter layer sections 115, 125 and 135 may extend.

Figure 10:
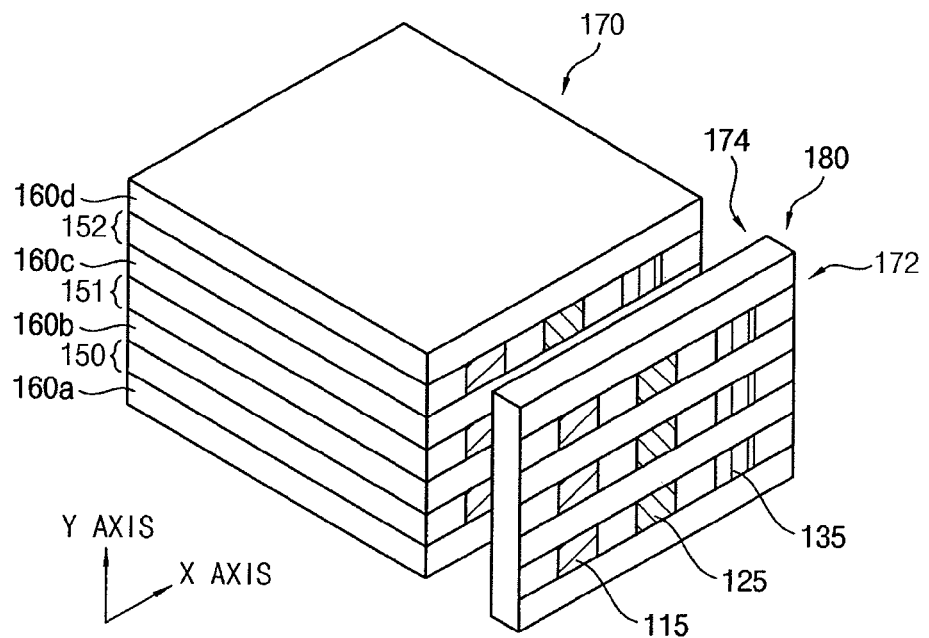

Referring to FIG. 10, the second stacked structure 170 may be cut or sliced to form a fourth cut face 174 to thereby provide an optical sheet 180.

A second portion of the second stacked structure 170 having the third cut face 172 may be cut by an optical process, a physical process, a thermal process, a chemical process or a combination thereof. In embodiments, the fourth cut face 174 may be substantially parallel to the third cut face 172, and may be spaced apart from the third cut face 172 by a predetermined distance. Therefore, the optical sheet 180 may have the third cut face 172 and the fourth cut face 174. The optical sheet 180 may include an array of the first to the third color filter layer sections 115, 125 and 135, which may be spaced apart from one another. In embodiments, the first color filter layer sections 115 may form an array having the same y-coordinates as illustrated in FIG. 10. Each of the second color filter layer sections 125 and the third color filter layer sections 135 may form an array having the same y-coordinates, respectively.

The first to the third color filter layer sections 115, 125 and 135 may correspond to the pixels of the display device, respectively (see FIG. 17). For example, the first to the third color filter layer sections 115, 125 and 135 may have substantially the same areas and shapes as those of the pixels. Therefore, the optical sheet 180 including the first to the third color filter layer sections 115, 125 and 135 may be obtained without performing any patterning process.

FIGS. 11 to 14 are perspective views illustrating a method of manufacturing an optical sheet in accordance with some embodiments.

Figure 11:
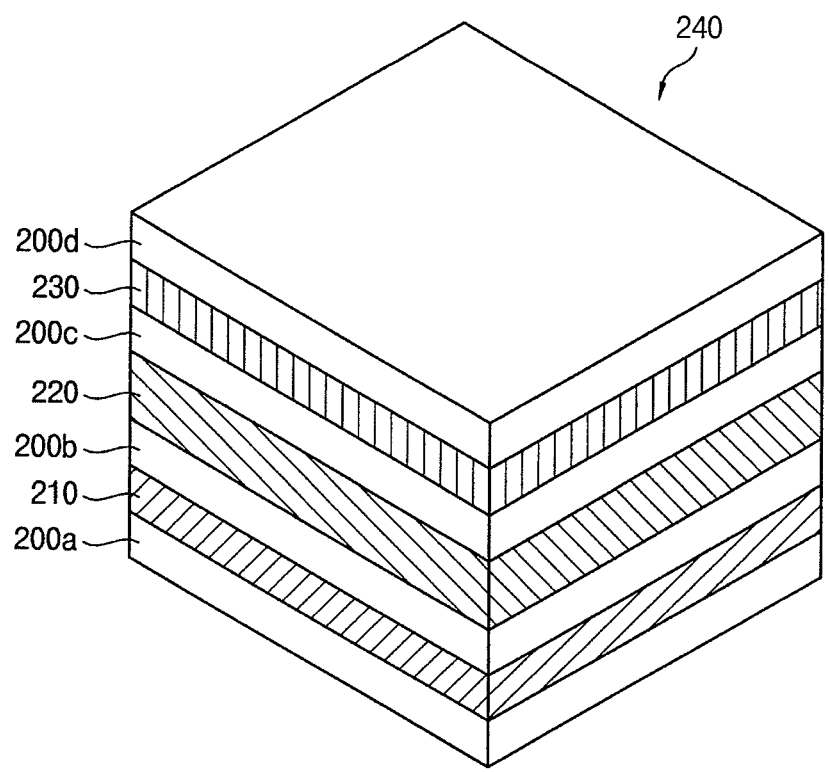

Referring to FIG. 11, a plurality of first light shielding layers 200a, 200b, 200c and 200d and first to third color filter layers 210, 220 and 230 may be stacked alternately and repeatedly, thereby providing a first stacked structure 240.

The processes of forming the first stacked structure 230 may be substantially the same as or substantially similar to the processes described with reference to FIGS. 1 to 3. However, the first color filter layer 210, the second color filter layer 220 and the third color filter layer 230 may have different thicknesses, respectively. In embodiments, the second color filter layer 220 may have a relatively high transmittance relative to a green color of light, and may have a thickness substantially larger than that of the first color filter layer 210 as illustrated in FIG. 11. Alternatively, the third color filter layer 230 may have a relatively high transmittance with respect to a blue color of light, and may have a thickness substantially larger than that of the first color filter layer 210. The thicknesses of the first to the third color filter layers 210, 220 and 230 may be substantially the same as or substantially similar to widths or heights of pixels of a display device, respectively.

The first stacked structure 240 may not be limited to the illustration in FIG. 11. For example, the first stacked structure 240 may include hundreds or thousands of the first light shielding layers and the color filter layers which may be stacked alternately and repeatedly.

Figure 12:
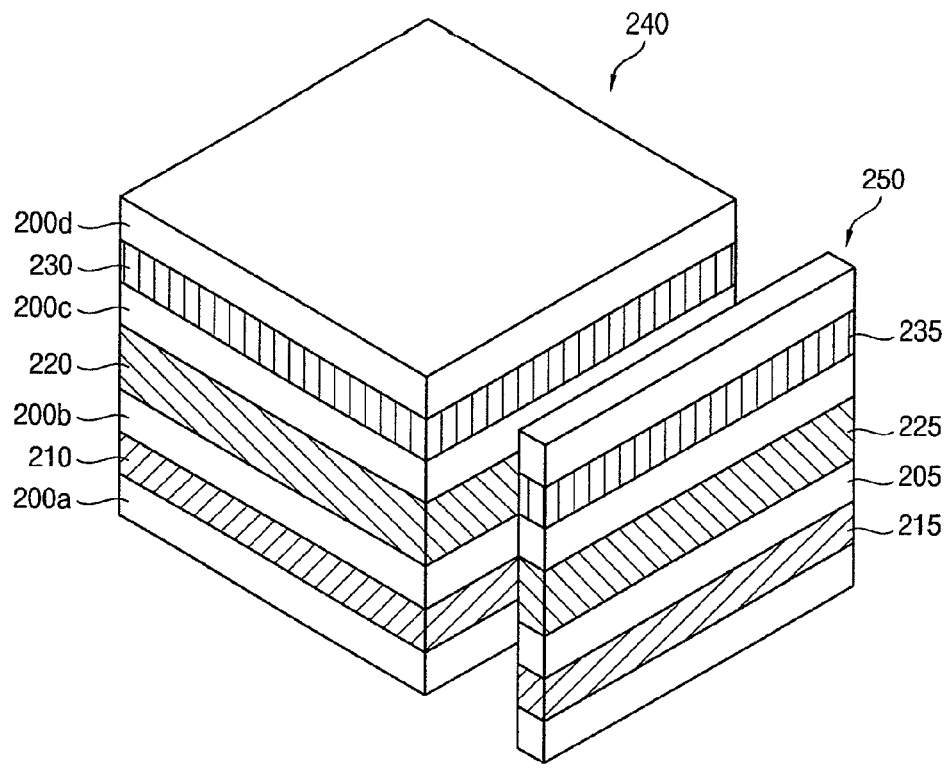

Referring to FIG. 12, the first stacked structure 240 may be cut or sliced to form a first optical film 250.

The processes of cutting the first stacked structure 240 may be substantially the same as or substantially similar to the processes described with reference to FIGS. 4 and 5. Therefore, the first optical film 250 may include a plurality of light shielding layer sections 205 and first to third color filter layer sections 215, 225 and 235 having different widths from one another.

Figure 13:
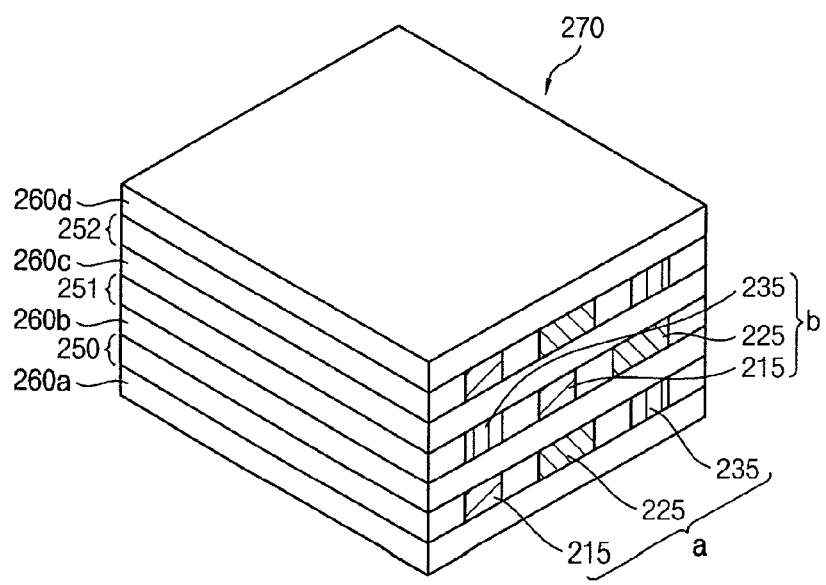

Referring to FIG. 13, second light shielding layers 260a, 260b, 260c and 260d and first to third optical films 250, 251 and 252 may be stacked alternately and repeatedly to provide a second stacked structure 270.

The first to the third optical films 250, 251 and 252 may be formed by repeatedly performing the processes described with reference to FIGS. 11 and 12. Then, the second light shielding layers 260a, 260b, 260c and 260d and the first to the third optical films 250, 251 and 252 may be stacked alternately and repeatedly.

In embodiments, each of the second light shielding layers 260a, 260b, 260c and 260d may have substantially the same thicknesses.

For convenience of illustration and description, the second stacked structure 270 may include four second light shielding layers 260a, 260b, 260c and 260d and three optical films 250, 251 and 252 illustrated in FIG. 13, however, the invention may not be limited to such configuration of the second stacked structure 270. For example, the second stacked structure 270 may include hundreds or thousands of the second light shielding layers and the optical films, which may be stacked alternately and repeatedly.

Figure 14:
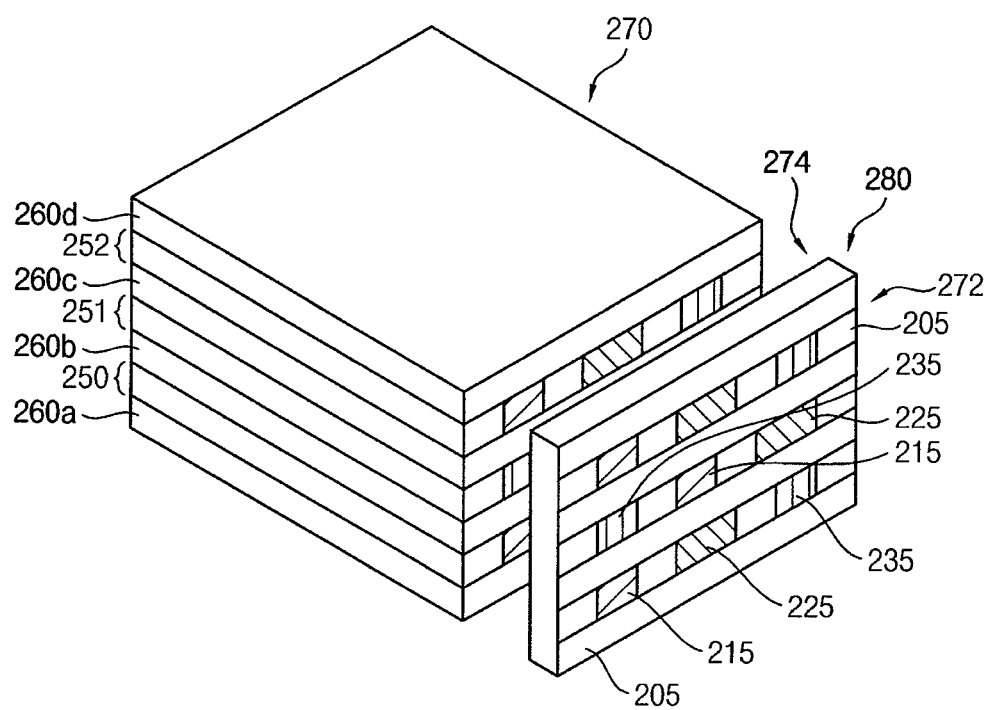

Referring to FIG. 14, the second stacked structure 270 may be cut or sliced to form an optical sheet 280 having a third cut face 272 and a fourth cut face 274.

The process of cutting the second stacked structure 270 may be substantially the same as or substantially similar to the processes described with reference to FIGS. 4 and 5. The third cut face 272 and the fourth cut face 274 may have a predetermined angle with respect to a direction in which the first to the third color filter layer sections 215, 225 and 235 may extend. For example, the third cut face 272 and the fourth cut face 274 may be substantially perpendicular to the direction. Further, the fourth cut face 274 may be spaced apart form the third cut face 272 by a predetermined distance. Therefore, the optical sheet 280 may be formed to include a light shielding layer pattern 205 and an array of the first to the third color filter segments 215, 225 and 235 which may be spaced apart from one another. The first to the third color filter segments 215, 225 and 235 may have different widths and areas, respectively.

The first to the third color filter segments 215, 225 and 235 may substantially correspond to the pixels of the display device (see FIG. 17). For example, the first to the third color filter segments 215, 225 and 235 may have areas and shapes substantially the same as those of the pixels, respectively.

Therefore, the optical sheet 280 including the first to the third color filter segments 215, 225 and 235 may be obtained without performing any patterning process.

Figure 15:
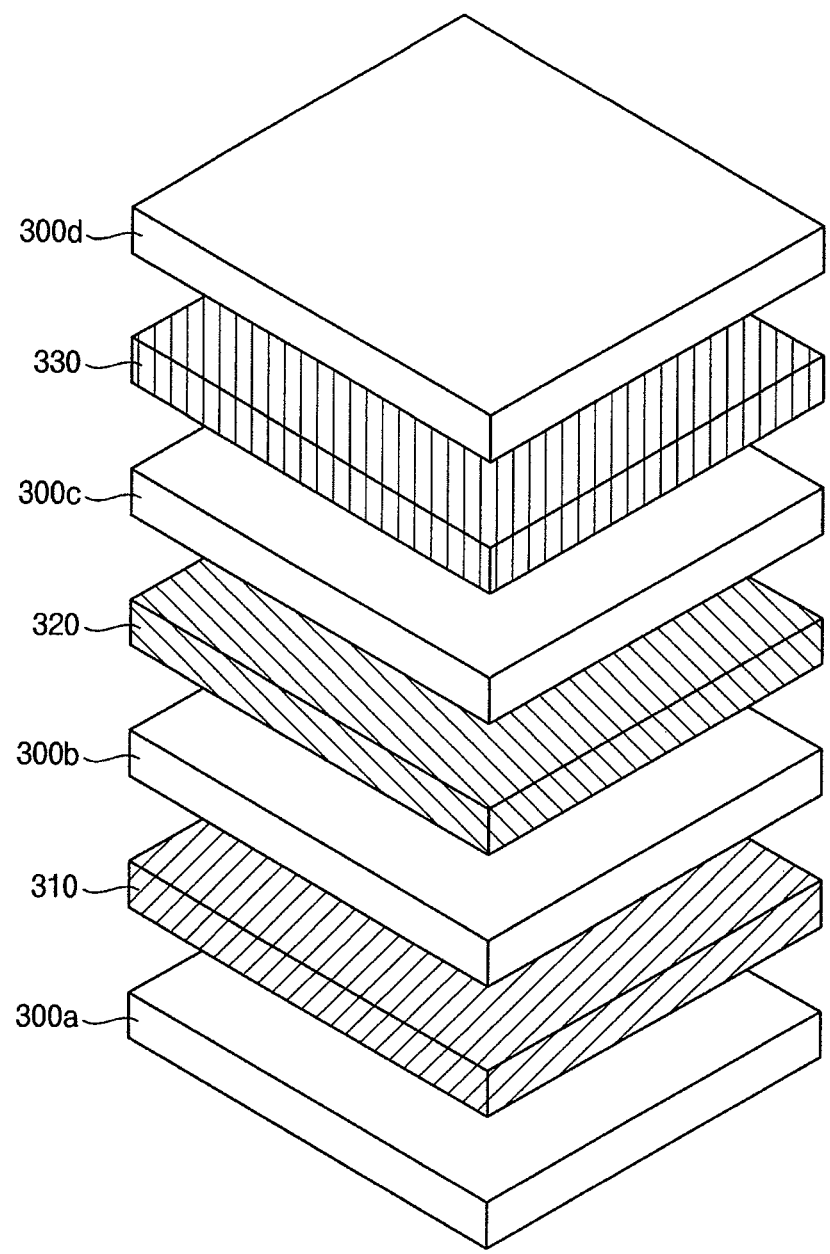
Figure 16:
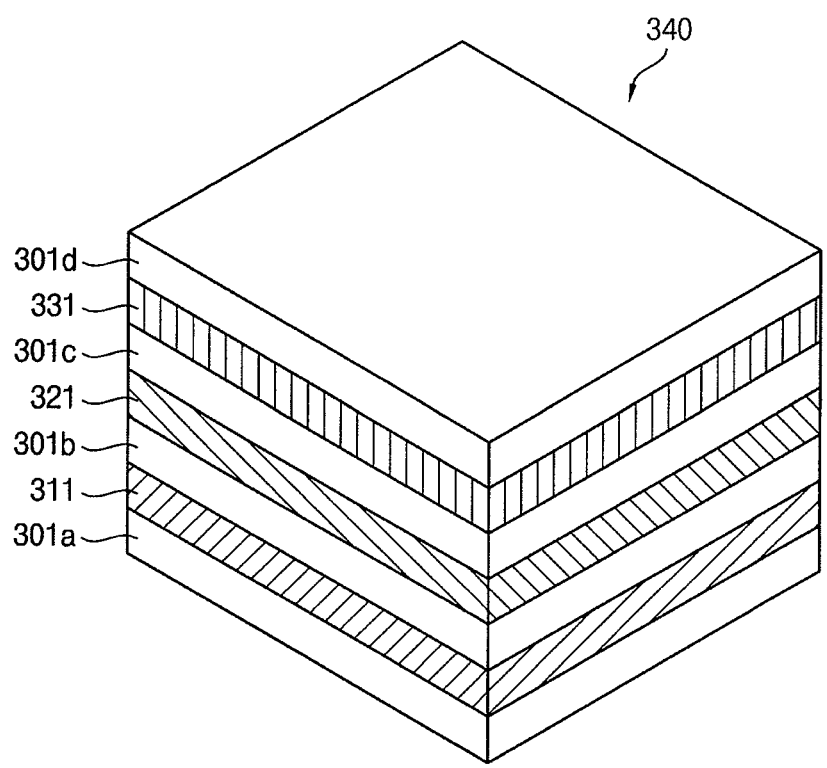

FIGS. 15 and 16 are perspective views illustrating a method of manufacturing an optical sheet in accordance with some embodiments.

Referring to FIG. 15, first light shielding films 300a, 300b, 300c and 300d and first to third color filter films 310, 320 and 330 may be arranged alternately and repeatedly.

In embodiments, hundreds or thousands of first light shielding films may be provided, and hundreds or thousands of the first to the third color filter films 310, 320 and 330 may also be provided.

In embodiments, the first light shielding films 300a, 300b, 300c and 300d may be substantially the same as or substantially similar to the first light shielding layers 100a, 100b, 100c and 100d described with reference to FIG. 1, and the first to the third color filter films 310, 320 and 330 may be substantially the same as or substantially similar to the first to third color filter layers 110, 120 and 130 described with reference to FIGS. 1 to 3.

In embodiments, each of the first light shielding films 300a, 300b, 300c and 300d may include a transparent pressure sensitive adhesive such as a rubber-based adhesive, an acryl-based adhesive, a vinyl ester-based adhesive, a silicon-based adhesive, an urethane-based adhesive, etc.

Referring to FIG. 16, the first light shielding films 300a, 300b, 300c and 300d and the first to the third color filter films 310, 320 and 330 may be combined to provide a first stacked structure 340 including first light shielding layers 301a, 301b, 301c and 301d and color filter layers 311, 321 and 331.

When the first light shielding films 300a, 300b, 300c and 300d additionally include the adhesive, the first stacked structure 340 may not require an additional adhesion layers for bonding the first light shielding films 300a, 300b, 300c and 300d and the first to the third color filter films 310, 320 and 330. In embodiments, when the first light shielding films 300a, 300b, 300c and 300d include pressure sensitive adhesives, the first light shielding films 300a, 300b, 300c and 300d and the first to the third color filter films 310, 320 and 330 may be arranged alternately and repeatedly, and then a pressure may be applied thereto for forming the first stacked structure 340.

For convenience of illustration and description, the first stacked structure 340 may include four first light shielding layers 301a, 301b, 301c and 301d and three color filter layers 311, 321 and 331 illustrated in FIG. 16, however, the invention may not be limited to this configuration of the first stacked structure 340. For example, the first stacked structure 340 may include hundreds or thousands of the first light shielding layers and the color filter layers, which may be stacked alternately and repeatedly.

The process for forming an optical sheet may be substantially the same as or substantially similar to the processes described with reference to FIGS. 4 to 10, and thus detailed descriptions thereof will be omitted.

Figure 18:
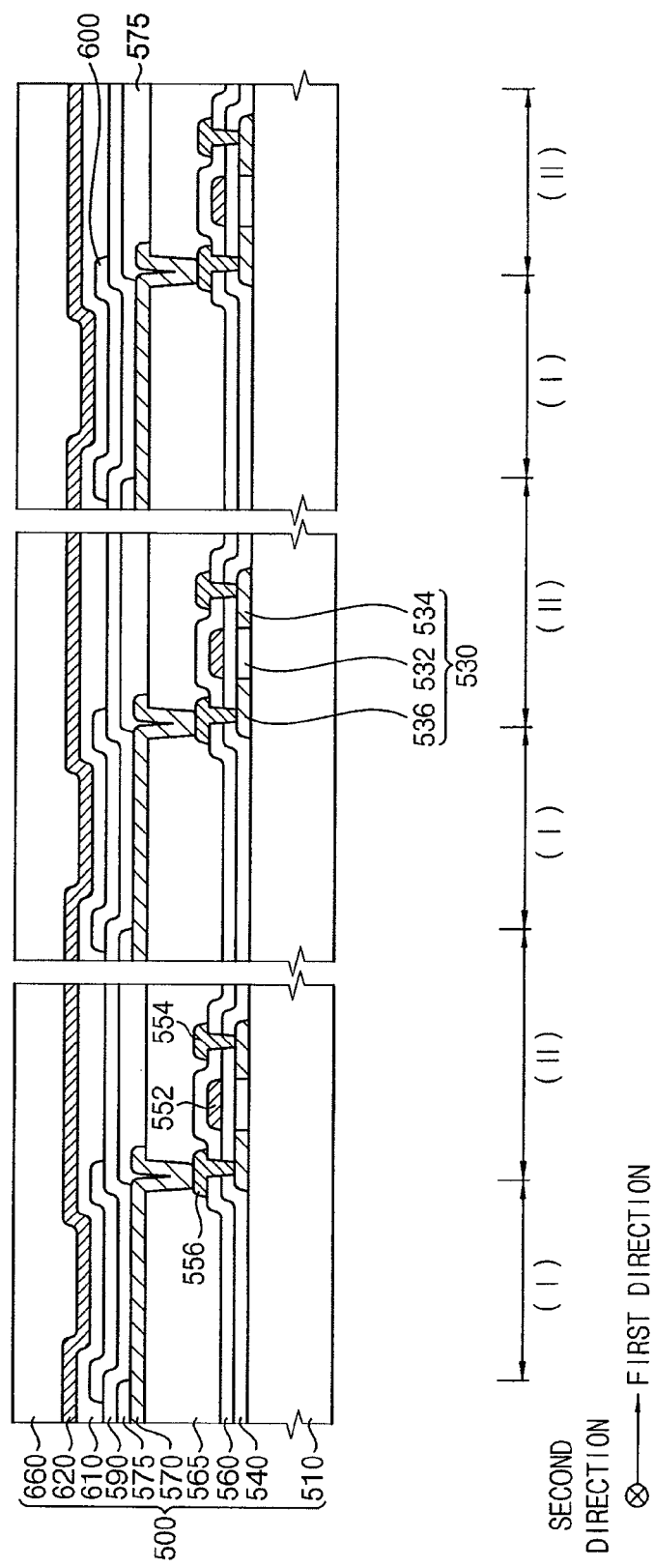
Figure 19:
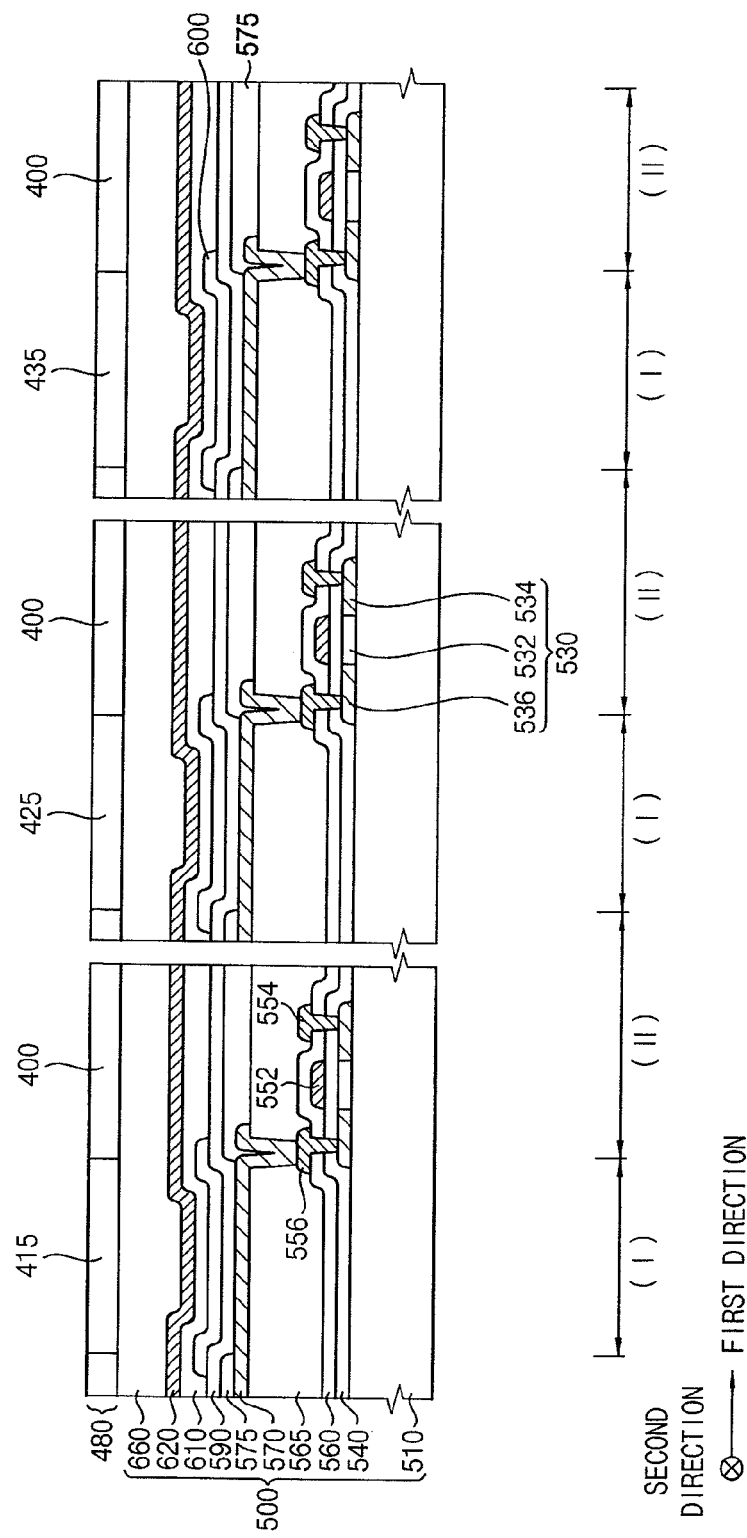

FIG. 17 is a perspective view illustrating a method of manufacturing an organic light emitting display device in accordance with embodiments, and FIGS. 18 and 19 are cross-sectional views illustrating the method of manufacturing the organic light emitting display device taken along a line I-I' in FIG. 17.

Referring to FIG. 18, a display panel 500 of the organic light emitting display device may be provided.

The display panel 500 may be formed to include a first substrate 510, a switching structure, a first electrode 570, a light emitting structure, a second electrode 620, etc. Although the organic light emitting display device illustrated in FIG. 18 may have a bottom emission type, the organic light emitting display device may have a top emission type in accordance with materials included in the first and the second electrodes 570 and 620.

The first substrate 510 may include a transparent insulation substrate. For example, the first substrate 510 may include a glass substrate, a transparent plastic substrate, etc. Alternatively, the first substrate 510 may include a flexible substrate.

When the organic light emitting display device has an active matrix type, the switching structure may be formed on the first substrate 510. In embodiments, the switching structure may include a switching device, at least one insulation layer, a contact, a pad, a plug, etc. Here, the switching device may include a thin film transistor (TFT), an oxide semiconductor device, etc.

When the switching device in the switching structure includes the thin film transistor, the switching device may be obtained by forming a semiconductor layer 530, a gate electrode 552, a source electrode 554, a drain electrode 556, etc.

In embodiments, the semiconductor layer 530 may be formed on the first substrate 510, and the semiconductor layer 530 may be divided into a source region 534, a drain region 536 and a channel region 532 through an ion implantation process. Then, a gate insulation layer 540 may be formed to electrically isolate the semiconductor layer 530.

A gate electrode 552 may be formed on the gate insulation layer 540, and then a first insulation layer 560 may be formed on the gate insulation layer 540 and the gate electrode 552.

The source electrode 554 and the drain electrode 556 may be formed through the gate insulation layer 540 and the first insulation layer 560 to contact the source and the drain regions 534 and 536, respectively. Then, a second insulation layer 560 may be formed to electrically isolate the source electrode 554 and the drain electrode 556.

In the organic light emitting display device illustrated in FIG. 18, the switching device including the thin film transistor may have a top gate configuration in which the gate electrode 552 may be disposed over the semiconductor layer 530, however, the configuration of the switching device may not be limited thereto. For example, the switching device may have a bottom gate configuration in which a gate electrode may be disposed under the semiconductor layer.

A second insulation layer 565 may be formed on the first insulation layer 560 to substantially cover the source electrode 554 and the drain electrode 556. In embodiments, the second insulation layer 565 may have a substantially flat surface obtained by a planarization process, for example, a chemical mechanical polishing (CMP) process, an etch-back process, etc.

The first electrode 570 may be formed on the switching structure, and a pixel defining layer 575 may be formed in a region on the switching structure where the first electrode 570 is not positioned.

Referring to FIG. 18, the light emitting structure may be obtained by forming a hole transfer layer 590, by forming an organic light emitting layer 600, by forming an electron transfer layer 610, etc. The organic light emitting layer 600 may be formed using an organic material or a mixture of an organic material and an inorganic material for generating a red color of light, a green color of light and/or a blue color of light. In some embodiments, the organic light emitting layer 600 may have a stacked structure that includes a plurality of light emitting films for generating the red color of light, the green color of light and the blue color of light to thereby provide a white color of light.

In embodiments, the organic light emitting layer 600 may be formed in each pixel region or pixel I, and the pixel defining layer 575 may be formed in the peripheral region or non-pixel region II. Therefore, light generated from the organic light emitting layer 600 may be emitted in the pixel regions I whereas the light may not be emitted in the peripheral region II. In other words, the pixel defining layer 575 may define each pixel region I of the organic light emitting display device.

In embodiments, the first electrode 570 may serve as an anode for providing holes into the hole transfer layer 590 of the light emitting structure, and the second electrode 620 may serve as a cathode for supplying electrons into the electron transfer layer 610. Depending on an emission type of the organic light emitting display device, the first electrode 570 may be a transparent electrode or a semi-transparent electrode, and the second electrode 620 may be a reflective electrode. For example, the first electrode 570 may be formed using a transparent conductive material such as indium tin oxide (ITO), zinc tin oxide (ZTO), indium zinc oxide (IZO), zinc oxide (ZnOx), tin oxide (SnOx), gallium oxide (GaOx), etc. The second electrode 620 may be formed using a reflective material such as aluminum (Al), tungsten (W), copper (Cu), nickel (Ni), chromium (Cr), molybdenum (Mo), titanium (Ti), platinum (Pt), silver (Ag), tantalum (Ta), ruthenium (Ru), alloys thereof, nitrides thereof, etc. These may be used alone or in a combination thereof.

The second substrate 660 may be formed on the second electrode 620. The second substrate 660 may be formed using a transparent substrate such as a glass substrate, a quartz substrate, a transparent resin substrate, etc. Alternatively, the second substrate 660 may be formed using a flexible material. The second substrate 660 may substantially oppose to the first substrate 510.

The display panel 500 may include pixel regions I and a peripheral region II. The pixel regions I may be arranged in a first direction and a second direction substantially perpendicular to the first direction. For example, the pixel regions I may be arranged in a substantial matrix structure. The peripheral region II may surround the pixel regions I. In embodiments, the pixel regions I may include a first pixel for a red color of light, a second pixel for a green color of light and a third pixel for a blue color of light.

Referring to FIGS. 17 and 19, an optical sheet 480 may be formed on the display panel 500.

The processes of forming the optical sheet 480 may be substantially the same as or substantially similar to the processes described with reference to FIGS. 1 to 10. That is, the optical sheet 480 may include first to third color filter segments 415, 425 and 435 and a light shielding section 400.

The first to the third color filter segments 415, 425 and 435 may respectively correspond to the pixel regions I, and the light shielding matrix 400 may correspond to the peripheral region II. For example, the first color filter segments 415 may correspond to the red color pixel, the second color filter segments 425 may correspond to the green color pixel and the third color filter segments 435 may correspond to the blue color pixel.

A viewing angle of the organic light emitting display device may be controlled by changing a thickness of the optical sheet 480. In embodiments, when the optical sheet 480 has a relatively large thickness, the viewing angle of the organic light emitting display device may decrease. That is, colors of light proceeding in a direction substantially perpendicular to the optical sheet 480 (i.e., a front direction of the organic light emitting display device) may pass through the first color filter segment 415, the second color filter segment 425 or the third color filter segment 435. However, colors of light proceeding in a direction having a predetermined angle with respect to the front direction (i.e., a lateral direction of the organic light emitting display device) may be blocked by the light shielding section 400. When the optical sheet 480 has a relatively large thickness, the colors of light proceeding in the front direction may pass through the optical sheet 480, and the colors of light proceeding in the lateral direction may be blocked. Accordingly, the viewing angle of the organic light emitting display device may decrease.

According to embodiments, the optical sheet 480 including the first to the third color filter segments 415, 425 and 435 may be obtained without performing any patterning process. The optical sheet 480 may be arranged on the display panel 500 to improve color purity in each pixel region of the organic light emitting display device. Therefore, a quality of images of the organic light emitting display device may be improved.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of manufacturing an optical sheet, the method comprising:
   providing a first stacked structure comprising a plurality of first light shielding layers and a plurality of color filter layers which are alternately stacked;
   cutting the first stacked structure to form a plurality of optical films, each of which comprises first and second cut faces, the second cut face being parallel to the first cut face, each optical film comprising a plurality of light shielding layer sections and a plurality of color filter layer sections extending in a first direction, two immediately neighboring light shielding layer sections being spaced apart from each other and two immediately neighboring color filter layer sections being spaced apart from each other;
   forming a second stacked structure comprising a plurality of second light shielding layers and the plurality of optical films which are alternately stacked;
   cutting the second stacked structure to form an optical sheet which comprises third and fourth cut faces, the fourth cut face being parallel to the third cut face.

2. The method of claim 1, wherein a distance between the first cut face and the second cut face defines a thickness of the optical film, and a distance between the third cut face and the fourth cut face defines a thickness of the optical sheet.

3. The method of claim 1, wherein the first cut face and the second cut face are parallel to the first direction, and the third cut face and the fourth cut face are perpendicular to the first direction.

4. The method of claim 1, wherein forming the first stacked structure comprises repeatedly performing a cycle of forming one first light shielding layer on one color filter layer and forming another color filter layer on the one first shielding layer.

5. The method of claim 1, wherein forming the first stacked structure comprises:
   providing a plurality of first light shielding films;
   providing a plurality of color filter films;
   alternately arranging the color filter films and the first light shielding films, respectively; and
   laminating the color filter films and the first light shielding films to form the first stacked structure comprising the color filter layers and the first light shielding layers.

6. The method of claim 1, wherein forming the second stacked structure comprises repeatedly performing a cycle of forming one second light shielding layer on one optical film and forming another optical film on the one second light shielding layer.

7. The method of claim 1, wherein forming the second stacked structure comprises:
   providing a plurality of second light shielding films;
   providing a plurality of optical films;
   alternately arranging the optical films and the second light shielding films, respectively; and
   laminating the optical films and the second light shielding films to form the second stacked structure comprising the plurality of second light shielding layers and the plurality of optical films.

8. The method of claim 1, wherein each of the color filter layers has the same thickness, each of the first light shielding layers has the same thickness, each of the optical films has the same thickness and each of the second light shielding layers has the same thickness.

9. The method of claim 1, wherein each of the first light shielding layers has the same thickness, each of the second light shielding layers has the same thickness, at least two of the color filter layers have different thicknesses from each other, and at least two of the optical films have different thicknesses from each other.

10. The method of claim 1, wherein the color filter layers comprise a first color filter layer configured to transmit a red color of light, a second color filter layer configured to transmit a green color of light and a third color filter layer configured to transmit a blue color of light.

11. The method of claim 1, wherein the optical sheet includes a first color filter segment configured to transmit a red color of light, a second color filter segment configured to transmit a green color of light and a third color filter segment configured to transmit a blue color of light.

12. A method of manufacturing an organic light emitting display device, the method comprising:
   forming a display panel comprising a switching device, a first electrode, an organic light emitting structure and a second electrode, the display panel comprising an array of pixels and a non-pixel region neighboring the pixels, wherein the pixels are arranged in a first direction and a second direction perpendicular to the first direction; and
   providing an optical sheet over the display panel,
   wherein providing the optical sheet comprising:
      providing a first stacked structure comprising a plurality of first light shielding layers and a plurality of color filter layers which are alternately stacked;
      cutting the first stacked structure to form a plurality of optical films, each of which comprises first and second cut faces, the second cut face being parallel to the first cut face, each optical film comprising a plurality of light shielding layer sections and a plurality of color filter layer sections extending in a first direction, and two immediately neighboring light shielding layer sections being spaced apart from each other, and two immediately neighboring color filter layer patterns being spaced apart from each other;
      forming a second stacked structure a plurality of second light shielding layers and the plurality of optical films which are alternately stacked;
      cutting the second stacked structure to form an optical sheet which comprises third and fourth cut faces, the fourth cut face being parallel to the third cut face.

13. The method of claim 12, wherein a distance between the first cut face and the second cut face defines a thickness of the optical film, and a distance between the third cut face and the fourth cut face defines a thickness of the optical sheet.

14. The method of claim 12, wherein the first cut face and the second cut face are parallel to the first direction, and the third cut face and the fourth cut face are perpendicular to the first direction.

15. The method of claim 12, each of the color filter layers has the same thickness, each of the first light shielding layers has the same thickness, each of the optical films has the same thickness and each of the second light shielding layers has the same thickness.

16. The method of claim 15, wherein the thickness of one of the color filter layers is substantially the same as at least one of width and height of one of the pixels.

17. The method of claim 15, wherein the thickness of one of the optical films is substantially the same as at least one of width and height of one of the pixels.

18. The method of claim 15, wherein the array of pixels comprises a first pixel, a second pixel and a third pixel, and wherein the optical sheet comprises a first color filter segment corresponding to the first pixel, a second color filter segment corresponding to the second pixel and a third color filter segment corresponding to the third pixel.

* * * * *